US011348905B2

(12) United States Patent
Wang et al.

(10) Patent No.: US 11,348,905 B2
(45) Date of Patent: May 31, 2022

(54) METHOD AND SYSTEM FOR ASSEMBLY OF MICRO-LEDS ONTO A SUBSTRATE

(71) Applicant: Palo Alto Research Center Incorporated, Palo Alto, CA (US)

(72) Inventors: Yunda Wang, Milpitas, CA (US); Jengping Lu, Fremont, CA (US); Qian Wang, Mountain View, CA (US); Sourobh Raychaudhuri, Mountain View, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 150 days.

(21) Appl. No.: 16/805,911

(22) Filed: Mar. 2, 2020

(65) Prior Publication Data

US 2021/0272935 A1    Sep. 2, 2021

(51) Int. Cl.
*H01L 21/66*     (2006.01)
*G01R 31/26*     (2020.01)
*H01L 25/075*    (2006.01)
*H01L 25/16*     (2006.01)
*H01L 33/00*     (2010.01)

(52) U.S. Cl.
CPC .......... *H01L 25/0753* (2013.01); *H01L 22/22* (2013.01); *H01L 25/167* (2013.01); *H01L 33/0095* (2013.01)

(58) Field of Classification Search
CPC ... H01L 25/0753; H01L 22/22; H01L 25/167; H01L 33/0095; H01L 2221/68354; H01L 33/0093; H01L 21/6835
See application file for complete search history.

(56) References Cited

U.S. PATENT DOCUMENTS

| 7,959,261 | B2 | 6/2011 | Anderson et al. |
| 7,985,636 | B2 | 7/2011 | Yeh et al. |
| 9,412,727 | B2 | 8/2016 | Menard et al. |
| 9,496,155 | B2 | 11/2016 | Menard et al. |

(Continued)

FOREIGN PATENT DOCUMENTS

| EP | 3425618    | 1/2019 |
| KR | 100998087  | 12/2010 |
| WO | 2019/147589 | 8/2019 |

OTHER PUBLICATIONS

Eisenhaure et al., "Laser-Driven Shape Memory Effect for Transfer Printing Combining Parallelism with Individual Object Control", Advanced Materials Technologies, vol. 1, Issue 7, Aug. 11, 2016.

(Continued)

*Primary Examiner* — Ismail A Muse
(74) *Attorney, Agent, or Firm* — Mueting Raasch Group

(57) ABSTRACT

MicroLED chips are transferred from an epitaxy wafer to a first coupon substrate. The first coupon substrate has a first, soft adhesive layer that temporarily holds the microLED chips. Using a first transfer substrate, a subset of the microLED chips are transferred from the first coupon substrate to a second coupon substrate having a second, soft adhesive layer. A pattern of microLED chips are transferred from another substrate to the second coupon substrate via a second transfer substrate to fill vacancies in the subset of microLED chips. The transfer substrates are operable to hold and release pluralities of micro objects.

23 Claims, 7 Drawing Sheets

(56) References Cited

U.S. PATENT DOCUMENTS

| | | | |
|---|---|---|---|
| 9,555,644 B2 | 1/2017 | Rogers et al. | |
| 10,046,353 B2 | 8/2018 | Kim et al. | |
| 10,046,541 B2 | 8/2018 | Schneider et al. | |
| 10,252,083 B2 | 4/2019 | Clayton | |
| 10,304,991 B2* | 5/2019 | Liao | H01L 21/6838 |
| 10,431,569 B2 | 10/2019 | Li et al. | |
| 10,533,080 B2 | 1/2020 | Kim et al. | |
| 10,615,063 B2 | 4/2020 | Saketi et al. | |
| 2010/0035049 A1 | 2/2010 | Xie | |
| 2010/0129986 A1 | 5/2010 | Kamiya et al. | |
| 2016/0175238 A1 | 6/2016 | Shin et al. | |
| 2016/0219702 A1 | 7/2016 | Chaji et al. | |
| 2017/0062400 A1* | 3/2017 | Li | H01L 25/18 |
| 2017/0215280 A1 | 7/2017 | Chaji | |
| 2017/0358478 A1 | 12/2017 | Thothadri et al. | |
| 2018/0100046 A1 | 4/2018 | Kim et al. | |
| 2018/0138357 A1* | 5/2018 | Henley | H01L 25/0753 |
| 2018/0261582 A1 | 9/2018 | Henry et al. | |
| 2019/0393069 A1 | 12/2019 | Paranjpe et al. | |
| 2020/0328198 A1* | 10/2020 | Takeya | H01L 21/6835 |
| 2021/0111148 A1* | 4/2021 | Chen | H01L 21/6835 |
| 2021/0151622 A1* | 5/2021 | Ting | H01L 33/005 |
| 2021/0193497 A1* | 6/2021 | You | H01L 25/0753 |
| 2021/0242287 A1* | 8/2021 | Chaji | H01L 27/326 |
| 2021/0343567 A1* | 11/2021 | Han | H01L 21/6835 |
| 2021/0384174 A1* | 12/2021 | Liu | H01L 25/0753 |
| 2022/0043890 A1* | 2/2022 | Choi | G06T 1/005 |

OTHER PUBLICATIONS

Kagami et al., "Shape Memory Behaviors of Crosslinked Copolymers Containing Stearyl Acrylate", Macromolecular Rapid Communications, vol. 17, Issue 8, Aug. 1996.

Matsuda et al., "Order-Disorder Transition of a Hydrogel Containing an n-Alkyl Acrylate", Macromolecules, 27, 1994, pp. 7695-7698.

Plate et al., "Structure of Crystalline Polymers with Unbranched Long Side Chains", Journal of Polymer Science Part A-1 Polymer Chemistry, vol. 9, No. 8, Aug. 1971, pp. 2291-2298.

European Search Report from EP Application No. 21157734.1 dated Jul. 27, 2021, 7 pages.

Wang et al., U.S. Appl. No. 16/681,215, filed Nov. 12, 2019.

* cited by examiner

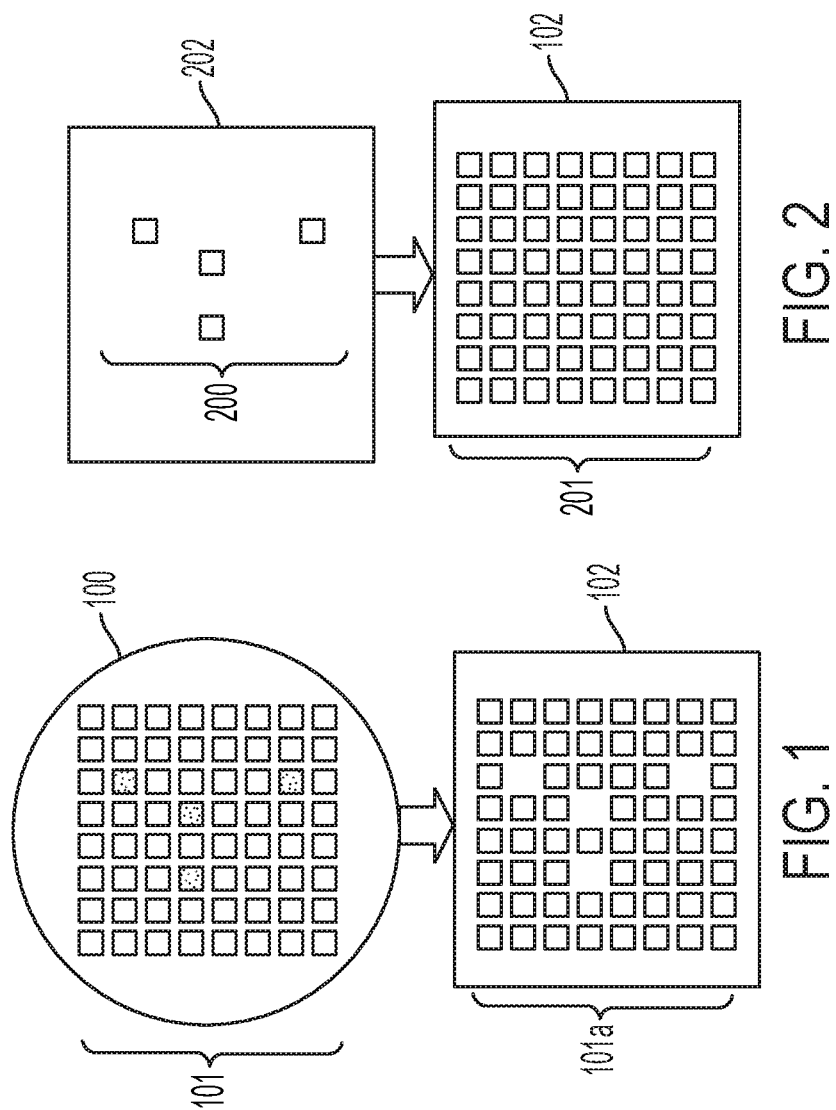

METHOD AND SYSTEM FOR ASSEMBLY OF MICRO-LEDS ONTO A SUBSTRATE

SUMMARY

The present disclosure is directed to a method and system for assembly of micro-LEDs onto a substrate. In one embodiment microLED chips are transferred from an epitaxy wafer to a first coupon substrate. The first coupon substrate has a first, soft adhesive layer that temporarily holds the microLED chips. Via a first transfer substrate, a subset of the microLED chips are transferred from the first coupon substrate to a second coupon substrate having a second, soft adhesive layer that temporarily holds the subset of microLED chips. A pattern of microLED chips are transferred from another substrate to the second coupon substrate via a second transfer substrate to fill vacancies in the subset of microLED chips. The first and second transfer substrates are operable to simultaneously hold and release pluralities of micro objects.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures. The drawings are not necessarily to scale.

FIGS. 1 and 2 are block diagrams showing an assembly process according to an example embodiment

DETAILED DESCRIPTION

Figure 3:
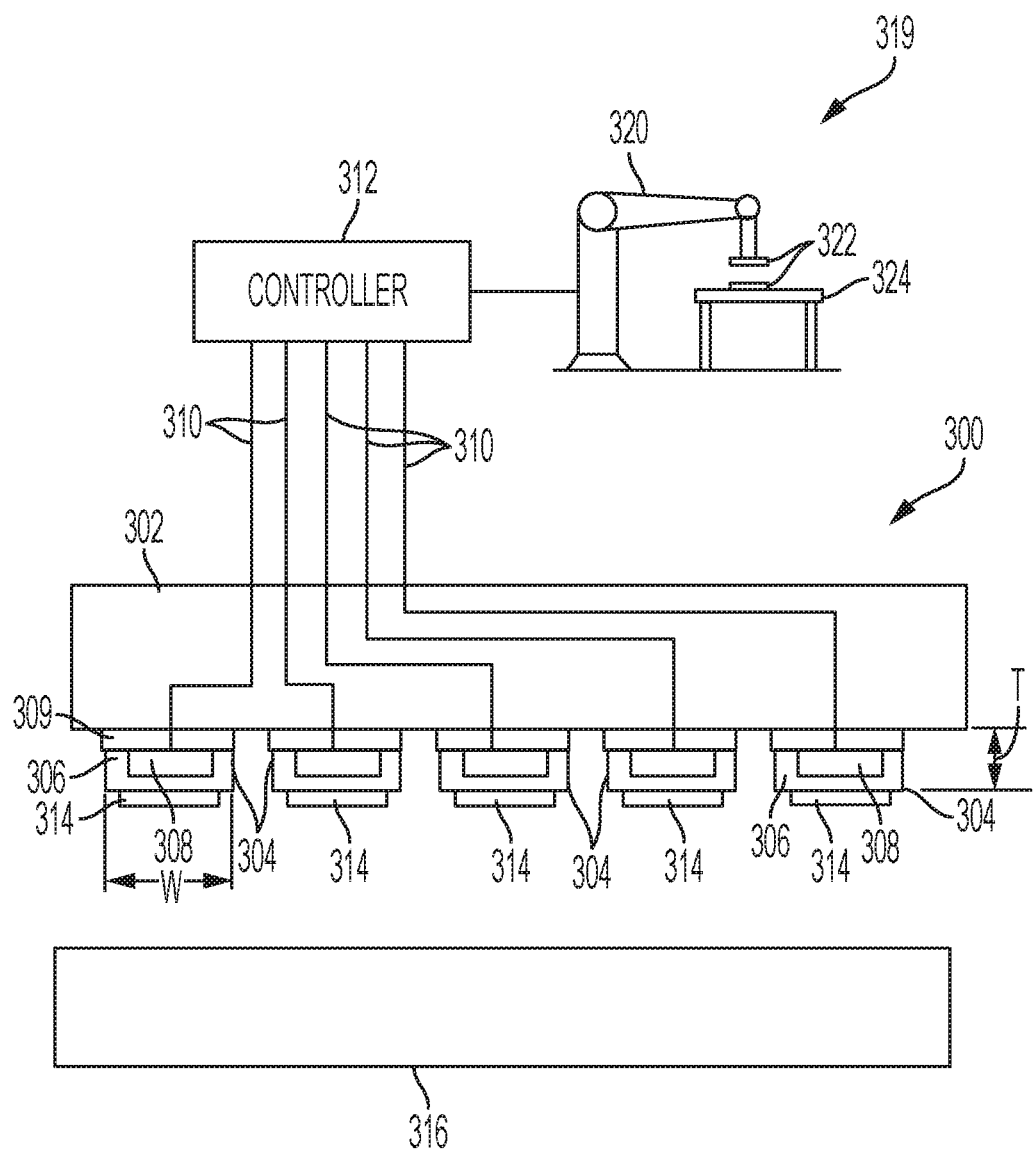
FIG. 3 is a block diagram of an apparatus and system according to an example embodiment.

The present disclosure relates to a system and method for transferring large number of micro objects (e.g., particles, chiplets, mini/micro-LED dies) from a donor substrate to another substrate in parallel while maintaining high position registration of the individual micro objects. The method and system allows selectively transferring of micro objects from a transfer substrate and selectively place the micro objects to the destination or target substrate. This method and system can be used for assembling microLED displays and similar devices.

MicroLED is emerging as next generation display technology because of its potential to be a thinner, brighter, lighter, and low power display. MicroLED displays are made with arrays of microscopic LEDs each forming a pixel. Both OLED displays and microLED displays offer greatly reduced energy requirements compared to conventional LCD systems. Unlike OLED, microLED is based on conventional GaN LED technology, which offers higher total brightness than OLED produces, as well as higher efficiency in terms of light emitted per unit of power. It also does not suffer from the shorter lifetimes of OLED.

A single 4K television utilizing microLED has ~25 million small LED subpixels that then need to be assembled. Mass transfer of chiplets is one technology that may be used for microLED manufacturing. The display assembly process which relies on mass transfer technology is one of the bottlenecks in the micro LED manufacturing process. Display typically requires a very high pixel yield which is higher than a single epitaxy wafer can achieved. Thus, assembly techniques should provide a way to avoid transferring non-functional LEDs to the display substrates. For example, defective micro LEDs on wafers and donor carriers could be eliminated and replaced with good ones during the mass transfer process in an efficient way, leading to overall yield improvement with low manufacturing cost.

In this disclosure, a mass-transfer method and system are described that can exploit such kind of selectively transfer head to assemble microLED displays of high pixel yield in an efficient way. The system and method supports known good die (KGD) chip transfer and parallel pixel repairing during the mass transfer process.

Being able to selectively transfer chiplets in an arbitrary pattern on demand is useful to facilitate the effective transfer process, pixel repair, hole/vacancy refill for microLED display manufacturing, which will lead to high process yield. An elastomer stamp has been used to deterministically transfer microscale LED chips for this type of application. However, an elastomer stamp has fixed pattern and cannot transfer arbitrary pattern of chiplets. Inevitably, some subset of the chiplets will be defective, and therefore it becomes difficult to replace a select few of them using such a stamp.

In FIGS. 1 and 2, block diagrams show an example of an assembly process that can be achieved using devices, systems, and methods according to an example embodiment. In FIG. 1, a donor wafer/substrate 100 is shown that includes an array of chiplets 101 that may have been grown or placed on the substrate 100. The shaded chiplets in the array 101 have been identified as defective, and when the chiplets are transferred to a target substrate 102, only a subset 101a of the chiplet array are transferred, namely the good chiplets that are not shaded. This may be achieved with a transfer substrate 202 as shown in FIG. 2 that can selectively pick up just the subset 101a from the donor substrate 100 once they are identified. As shown in FIG. 2, the transfer substrate 202 subsequently picks up a second set of chiplets 200 (e.g., from a different donor substrate). The locations of the chiplets within the set 200 correspond to the locations of the defective chiplets on the first donor substrate 100. The transfer substrate 202 moves this set 200 to the target substrate 102, resulting in a full set 201 of operational chiplets being located on the target substrate 102.

The transfer substrate with a set of transfer elements (e.g., transfer pixels) can selectively hold a subset of micro objects. Thus, even when all of the transfer elements are in contact with an array of micro objects that is greater than the subset, only the subset will be adhere and be transferred, and the objects outside the subset will be left behind or otherwise unaffected. Similarly, the transfer substrate may be able to selectively release a subset of micro objects that are currently attached to the substrate, such that only the subset is transferred to a target even all of the transfer elements are currently holding a micro object. This process is repeatable and reversible, such that no permanent bonding is need to affect the selective holding or releasing of the objects.

In FIG. 3, a side view illustrates details of an apparatus 300 according to an example embodiment. The apparatus includes a transfer substrate 302 with two or more transfer elements 304. The transfer elements 304 can selectively made to change stiffness, which can be expressed as the Young's modulus of the material from which the elements are made. The Young's modulus is a measure of stress (force per unit area) divided by strain (proportional deformation) in a material in the linear elasticity regime. Generally, materials with higher Young's modulus (lower strain for a stress σ) is stiffer than a material with lower Young's modules (higher strain for the same σ). Other measures may also be used to represent stiffness of a material, such as storage modulus, which also accounts for dynamic performance of the material. Some measures may be used to represent stiffness of a part, such as a spring constant, that may be functionally equivalent in defining performance of the part. However the stiffness is defined, the transfer elements 304 have a change in stiffness in response to temperature that can be utilized in device transfer as described below.

Each of the transfer elements 304 includes an adhesion element 306 having a higher Young's modulus >6 MPa at a lower temperature and a lower Young's modulus <1 MPa at a higher temperature. Each of the transfer elements 304 also includes a thermal element 308 operable to change a temperature of the adhesion element 306 in response to an input, e.g., via inputs 310. A controller 312 is coupled to provide the inputs 310 to the thermal elements 308, thereby causing a subset of the transfer elements 304 to selectably pick up and hold objects 314 to and (optionally) release the objects 314 from the transfer substrate 302. In particular, the objects 314 will not stick to the transfer elements 304 at the lower temperature but will stick at the higher temperature. To increase the reliability of the adhesion, the transfer elements may be cooled before attempting to pull the objects 314 away from transfer substrate 302. Note that the change in temperature may affect other properties of the adhesion element 306 that can assist in selective adhesion and release of objects 314, such as tackiness, stickiness, porosity, fluid content, density, etc.

The apparatus 300 may be part of a micro-transfer system 319, which is a system used to transfer micro-objects (e.g., 1 μm to 1 mm) from the transfer substrate 302 to a target substrate 316. The adhesion element 306 may be formed of a multi-polymer that contains stearyl acrylate-based (SA). In such a case, a difference between the higher and lower temperatures may be less than 20° C. (or in other cases less than 50° C.) in order to adjust the tackiness of the adhesion element 306 such that there is a marked difference in surface adhesion and Young's modulus, e.g., from <1 MPa at the higher temperature to >6 MPa at the higher temperature. The controller 312 in such a system may be coupled to actuators that induce relative motion between substrates to facilitate object transfer as described herein.

The thermal element 308 may include one or both of a heating element and a cooling element. The inputs 310 may include electrical signals and/or laser light. The inputs 310 may be configured (e.g., using a matrix circuit) such that there are fewer lines going to the controller 312 than the total number of transfer elements 304. The transfer elements 304 may further include a thermal insulator 309 between the adhesion element 306 and the transfer substrate 302. The insulator 309 helps prevent heat transfer to the substrate 302, thereby decreasing the amount of energy needed to affect temperature change at the adhesion element 306 and decrease response time.

Generally, the transfer elements 304 form an intermediate transfer surface whose compliance can be modulated (e.g., have a sharp rigid-to-soft transition) as a function of temperature. Such a surface can be used to pick up and release groups of micro-objects in a controlled and selectable manner. Each transfer element 304 may have lateral dimensions W from one or more micrometers to several hundreds of micrometers to pick up micro objects of like dimensions.

Each transfer element 304 may have a total thickness T from less than one micron to several hundred microns. The pitch of the transfer array may vary from several microns to several millimeters. In some embodiment, the thermal elements 308 and insulating layers 309 are continuous layers that are not physically isolated from one another. As such, the transfer element "pixel" is the region where the heating/cooling elements can be individually addressed and controlled. The substrate 302 material may include but is not limited to glass, quartz, silicon, polymer and silicon carbide (SiC). The substrate 302 may have a thickness ranges from several tens of microns to several millimeters and lateral dimensions from several millimeters to one meter.

As noted above, the transfer substrate 302 can be part of an automated system used to build devices from microcomponents. For example, microLEDs can be assembled into displays using the transfer substrate 302. The controller 312 (which may include multiple processors and apparatuses) can also be used to control other devices to perform this automated assembly. By way of example, a robotic arm 320 and conveyer 324 are shown that can perform operations on wafers 322, such as flipping, bonding, selective removal and addition of micro objects, etc. The configuration and operation of these and other automated devices for purposes of micro device assembly is well-established in the art.

There are many possible variations on the structure of the transfer substrate 302 shown in in FIG. 3. Also, there are different materials that may be used for the transfer elements. A more complete description of these alternate embodiments are shown and described in commonly-owned U.S. patent application Ser. No. 16/681,215, filed Nov. 12, 2019, the content of which is hereby incorporated by reference. Many of these embodiments may be applicable to the production of a micro-LED device as described in greater detail below.

Figure 4:
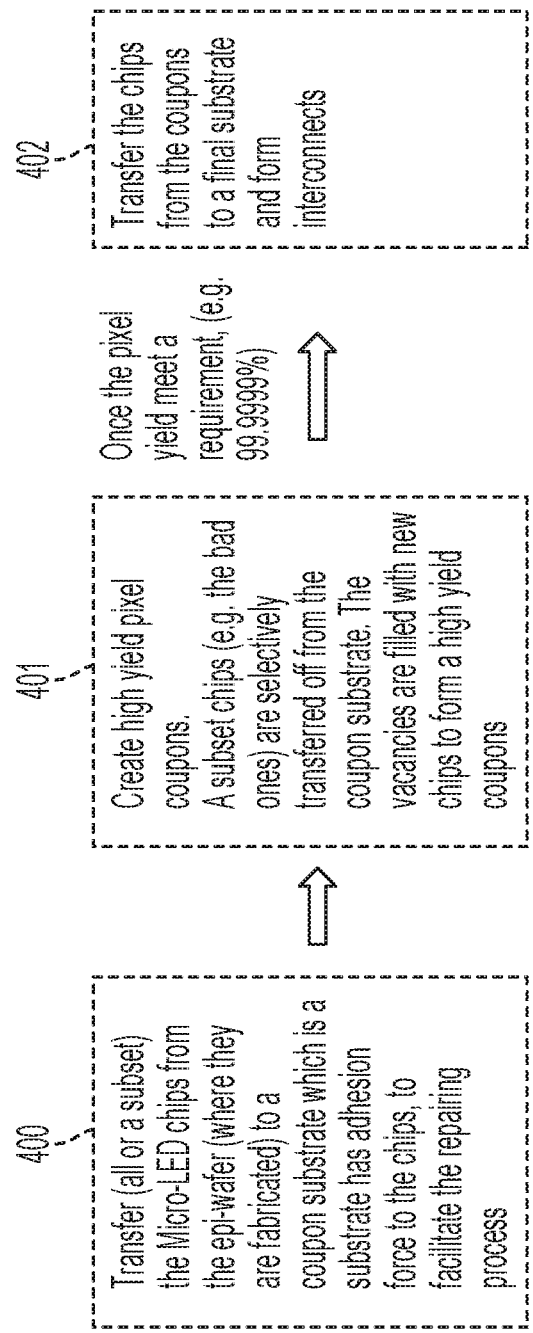
FIG. 4 is a block diagram showing a high-level assembly process according to an example embodiment.

In FIG. 4, a diagram illustrates high-level steps of a micro-LED device (e.g., display) manufacturing process according to an example embodiment. The first step 400 involves transferring (all or a subset, e.g. KGD) of the microLED chips from the epitaxy wafer where the chips were fabricated to a transition substrate. The transition substrate has an adhesive surface to temporarily hold the chips.

High-yield coupons are created 401 by selectively transferring a subset of chips from the transition substrate. This may involve repairing the coupon pixels through at least one of the two following activities: (1) selectively remove a subset of chips from the coupon substrate; (2) fill the vacancies with chips from a transition substrate or another coupon substrate. Step 401 may be repeated until the pixel yield of the coupon achieves some requirement, e.g., a threshold of 99.9999% known good pixels. The chips are then transferred 402 from the coupon substrate to a final substrate, where electrical interconnects are made to the backplane.

Figure 5:
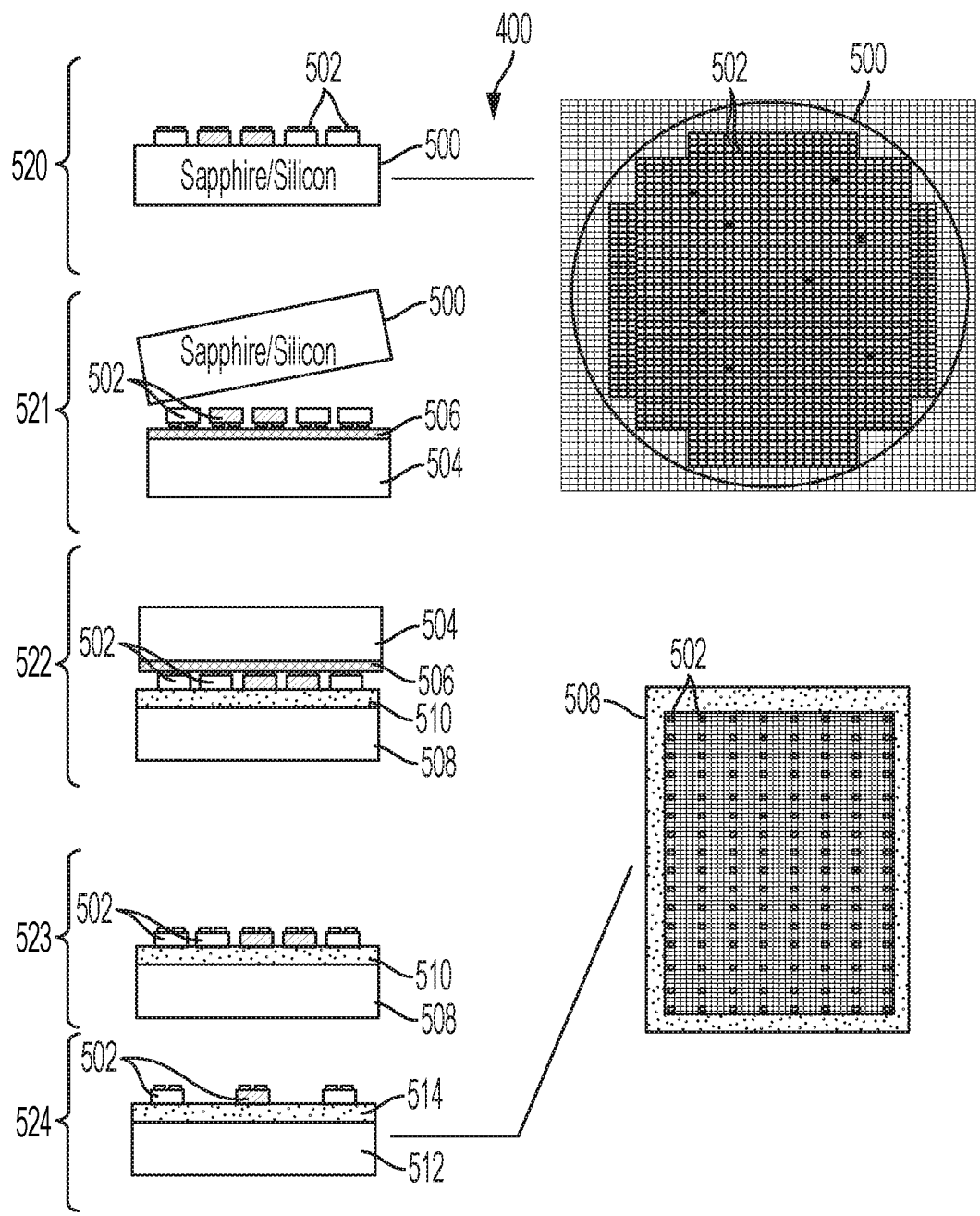
FIGS. 5, 6, and 7 are block diagrams showing detailed processing steps for the process shown in FIG. 4.

In FIG. 5, a diagram shows more detailed processes involved in step 400 shown in FIG. 4. Note that some of these processes may be optional, and the full listing of process steps is provided for purposes of illustration and not limitation. An epitaxy wafer 500 is formed 520, which includes a plurality of microLED chips 502. As indicated by the shaded rectangles on the wafer 500, some of the chips 502 may be determined defective, e.g., via visual inspection (e.g., microscope), electroluminescence and/or photoluminescence measurement. All or a subset of the micro-LED chips 502 are transferred 521 from the epitaxy wafer 500

(where they are fabricated) to a carrier substrate 504 (also referred to herein as a carrier wafer) which has an adhesive coating 506. In one embodiment, this transferring involves flipping the epitaxy wafer 500 and pressing to the adhesive coating 506 of the carrier substrate 504. The epitaxy wafer 500 is then released (shown in step 521) using a laser, e.g., by shining laser light through the epitaxy wafer 500 and/or the carrier substrate 504.

The adhesive coating 506 includes but not limited to ultraviolet (UV) releasable adhesive and thermal releasable adhesive. In these cases, the adhesive loses adhesion when treated with heating or UV illumination. As shown in 522, the carrier substrate 504 is flipped and placed in contact with a coupon substrate 508 which is a substrate with a mild adhesion force that holds the chips 502 to facilitate a repairing process. The coupon substrate 508 (which may include glass, silicon, quartz, etc.) is coated with at least a soft adhesion layer 510 of material such as PDMS and/or silicone gel. The soft adhesion layer 510 may also be referred to as a mild adhesion layer and/or a weak adhesion layer. As seen in 523, the carrier substrate 504 has been thermally released.

Generally, the soft adhesion layer 510 has sufficient adhesion to hold the chips 502 in place but allows for selective removal of the chips using a transfer substrate 302 such as shown in the apparatus 300 of FIG. 3. For example, a material with tensile strength between 1-9 MPa may be used for this removal and other soft adhesion layers described herein. The ultimate tensile strength selected for the soft adhesion material 510 may be dependent on the tensile strength of the transfer elements in their holding and release states. Generally, an adhesion force exerted by the soft adhesion layers 510 is less that the holding force of the transfer elements (when signals are applied to cause the transfer element to be in a holding state) and release force of the transfer elements (when signals are applied to cause the transfer element to be in a release state). For example, if the release/hold Young's moduli of the transfer element ranges from 1 MPa to 6 MPa, the Young's modulus of the soft adhesion layer 510 may be selected to be around 3.5 MPa.

In some embodiments, the operations shown in FIG. 4 may further comprise a process to adjust the pitches of chips 502 in the array, as seen in step 524. This may involve removing a subset of the chips from the coupon substrate 508 such that the remaining chips satisfy the new pitch specification. Alternatively, as shown in FIG. 3, the subset of chips 502 can be transferred to a second coupon substrate 512. The second coupon substrate 512 has a material layer 514 with similar properties as material layer 510. The transfer process, e.g., removing a subset of chips 502 from one coupon substrate 508 to a second coupon substrate 512 can be accomplished using a transfer substrate 302 such as shown in the apparatus 300 of FIG. 3.

Note that in FIG. 3, a failed/defective microLED 502 is shown transferred to the second coupon substrate 512. In other embodiments, the transfer from the first coupon substrate 508 to the second coupon substrate 512 may exclude any defective microLEDS. This may be accompanied by a change in the pitch of the transferred microLEDs 502 or not. Even if defective microLEDs are excluded from the transfer to the second coupon substrate 512, this does not preclude further removal and adding of microLEDS from/to the second coupon substrate 512 in later operations, as described below.

Figure 6:
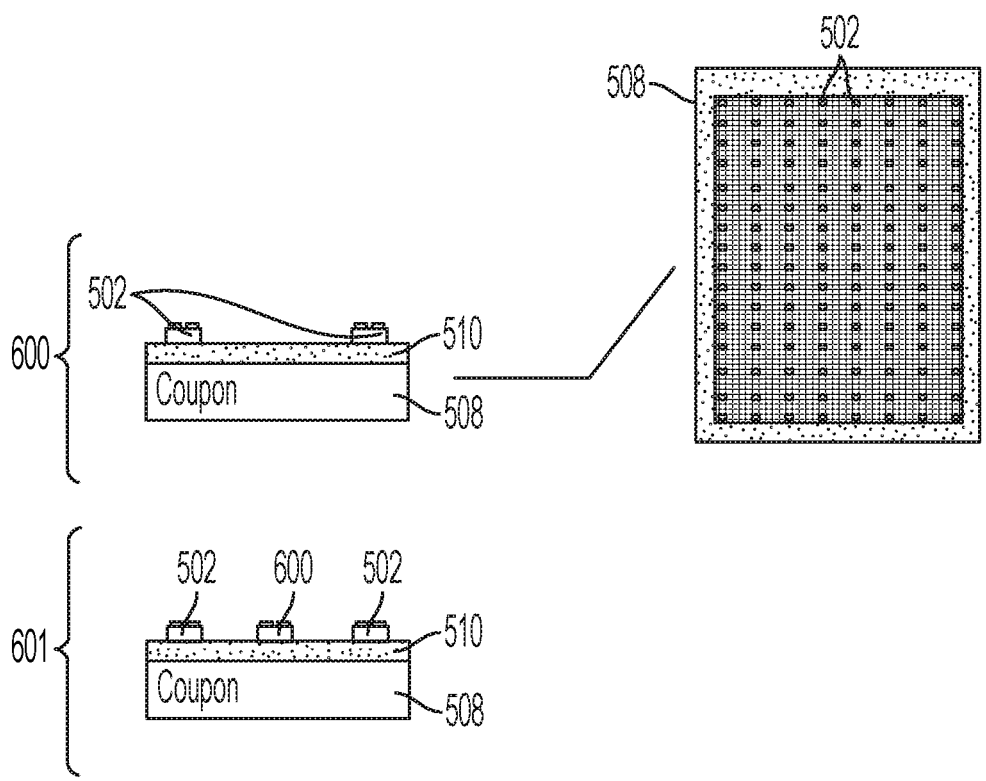

In FIG. 6, a diagram shows more detailed processes involved in step 401 shown in FIG. 4. This process is shown using the first coupon substrate 508, although could be performed on second coupon substrate 512. Generally as indicated by step 600, a subset of defective chips is identified (e.g., shaded chips 502 shown in FIG. 5) and lifted off the coupon substrate 508 using a transfer substrate 302. This technique may also be used to remove chips that are mispositioned or were not removed in the pitch-adjustment process shown in FIG. 5.

The removal of a subset of chips 502 from the coupon substrate 508 may create vacancies, e.g., where properly placed but defective chips were place. These vacancies are filled with new chips 600 to form high yield coupons, as indicated in step 601. This may involve using a transfer substrate 302 to selectively remove chips 600 from another coupon or similar donor substrate (e.g., substrate of glass, silicon, quartz or the like that is coated with PDMS, silicone gel or the like). The pattern of the removed 600 chips (which is set by applying appropriate activation signals to the transfer elements 304 of transfer substrate 302) may correspond to the pattern of the vacancies on the coupon substrate 508. The removed chips 600 are then placed on the coupon substrate 508 by the transfer substrate 302, where they are then release by selective application (or removal) of signals to the corresponding transfer elements 304.

In some embodiments, if more chips 600 are accidently or intentionally removed from the donor substrate by the transfer substrate 302 than are needed for the coupon substrate 508, only those chips 600 needed to fill the vacancies can be selectively released, while other chips remain attached to the transfer substrate 302. This can be achieved by the selective application/removal of signals to those transfer elements 304 such that chips that should not be transferred are held onto the transfer substrate 302, while chips that should be transferred will released by sending different signals to the affected transfer elements 304. After this occurs, the new chips 600 may be tested on the coupon substrate 208 together with the old chips 600 to ensure the coupon yield is sufficiently high.

Figure 7:
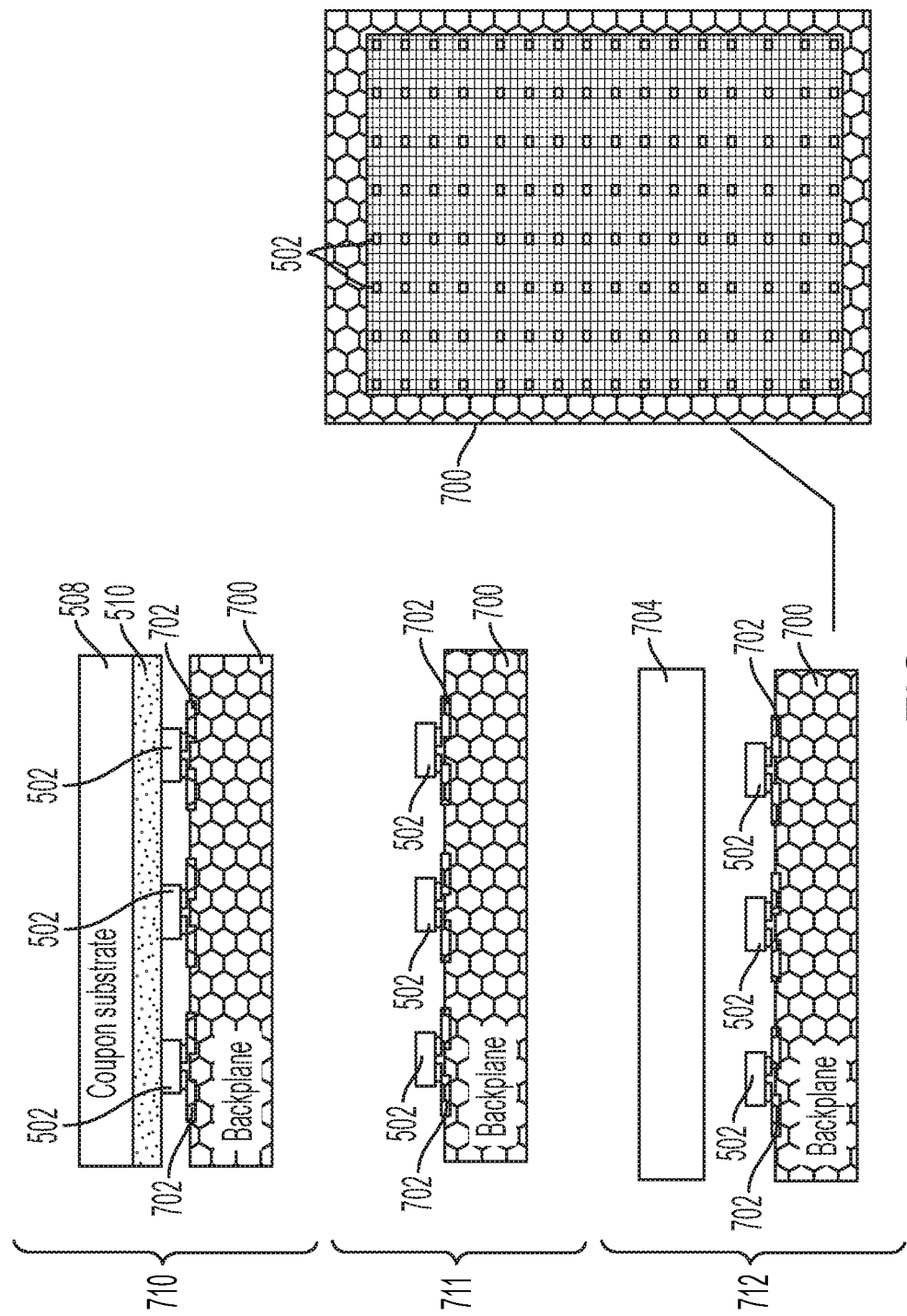

In FIG. 7, a diagram shows more detailed processes involved in step 402 shown in FIG. 4. As seen in step 710, the high-yield pixel coupon substrate 508 from FIG. 6 (which may alternatively be high-yield coupon substrate 512) is flipped and the microLED chips 502 are then aligned with and pressed against a backplane substrate 700, which is part of a display assembly. The backplane substrate 700 includes surface electrodes 702 that interface with corresponding electrodes on the microLED chips 502. The surface electrodes 702 are coupled to other components (e.g., electrical traces, passive or active electrical components such as resisters, capacitors, thin-film transistors, etc.). These other components (not shown) may be on the same surface as the electrodes 702 and/or on another surface (e.g., opposing surface) and/or internally embedded within layers of the backplane substrate 700.

In one embodiment, the process further involves a permanent bonding process (which may be performed as part of step 710) where the microLED chips 502 are bonded to the electrodes 702 on the backplane 700 using soldering, indium, low temperature metaling alloys, etc. During this bonding, the chips may be sandwiched between the coupon substrate 508 and the backplane 700. In some embodiments, after the bonds are formed, the coupon substrate 508 can be removed (e.g., peeled off), leaving the microLED chips seated on and electrically connected to the backplane as shown in step 711. In some embodiments as shown in step 712, a front cover 704 can put on top of the stack of the backplane 700 and microLED chips 502.

Figure 8:
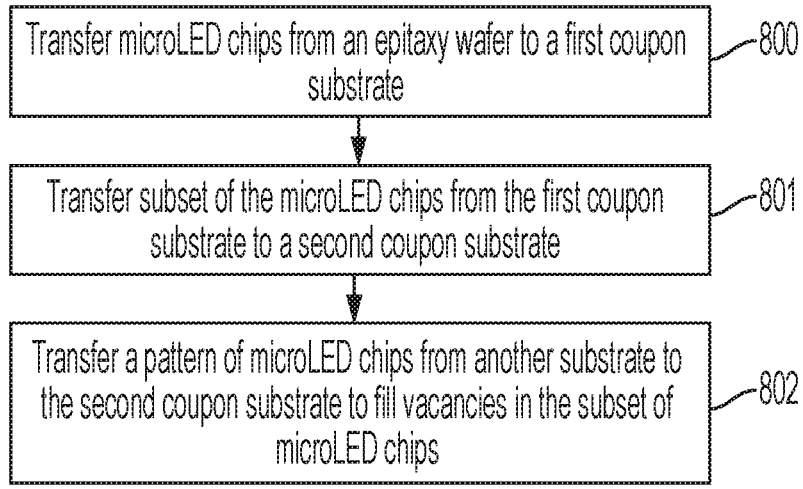
FIGS. 8 and 9 are flowcharts showing methods according to example embodiments.

In FIG. 8, a flowchart shows a method according to an example embodiment. The method involves transferring 800 microLED chips from an epitaxy wafer to a first coupon substrate. The first coupon substrate has a first, soft adhesive layer that temporarily holds the microLED chips. Using a first transfer substrate, a subset of the microLED chips are transferred 801 from the first coupon substrate to a second coupon substrate having a second, soft adhesive layer that temporarily holds the subset of microLED chips. A pattern of microLED chips are transferred 802 from another substrate to the second coupon substrate via a second transfer substrate to fill vacancies in the subset of microLED chips. Note that the second transfer substrate may be the same as the first transfer substrate. The vacancies may be due to a failed transfer from the first to second coupons, e.g., one or more microLEDs did not get picked up by or would not release from the first transfer substrate. The vacancies may also be due to failed microLEDs that were first selectively removed from the second coupon substrate. The first and second transfer substrates are operable to hold and release pluralities of micro objects, and may be the same transfer substrate.

Figure 9:
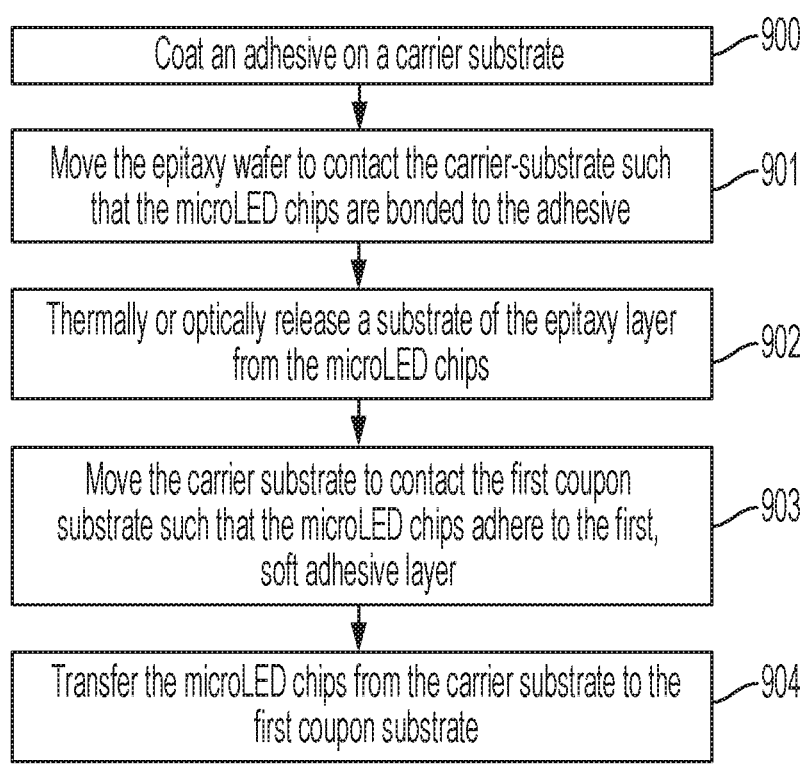

In FIG. 9, a flowchart shows a method of transferring 800 the microLED chips from the carrier substrate to the first coupon substrate according to an example embodiment. The method involves coating 900 an adhesive on a carrier substrate. The epitaxy wafer is moved 901 (e.g., flipped) to contact the carrier-substrate such that the microLED chips are bonded to the adhesive. A substrate of the epitaxy layer is thermally or optically released 902 from the microLED chips, e.g., by shining laser light through one of the carrier substrate and epitaxy wafer. The carrier substrate is moved 903 to contact the first coupon substrate such that the microLED chips adhere to the first, soft adhesive layer. The microLED chips are transferred 904 from the carrier substrate to the first coupon substrate. The transfer 904 may occur by application of ultraviolet light, heat, or mechanical force (e.g., shock and/or vibration).

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g. 1 to 5 includes 1, 1.5, 2, 2.75, 3, 3.80, 4, and 5) and any range within that range.

The various embodiments described above may be implemented using circuitry, firmware, and/or software modules that interact to provide particular results. One of skill in the arts can readily implement such described functionality, either at a modular level or as a whole, using knowledge generally known in the art. For example, the flowcharts and control diagrams illustrated herein may be used to create computer-readable instructions/code for execution by a processor. Such instructions may be stored on a non-transitory computer-readable medium and transferred to the processor for execution as is known in the art. The structures and procedures shown above are only a representative example of embodiments that can be used to provide the functions described hereinabove.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

The invention claimed is:

1. A method comprising:
   transferring microLED chips from an epitaxy wafer to a first coupon substrate, the first coupon substrate having a first, soft adhesive layer that temporarily holds the microLED chips;
   transferring via one or more transfer substrates, a subset of the microLED chips from the first coupon substrate to a second coupon substrate having a second, soft adhesive layer that temporarily holds the subset of the microLED chips; and
   transferring a pattern of microLED chips from another substrate to the second coupon substrate via the one or more transfer substrates to fill vacancies in the subset of the microLED chips, the one or more transfer substrates having a plurality of transfer elements that are individually actuated to respectively hold and release the subset of the microLED chips and the pattern of the microLED chips as groups.

2. The method of claim 1, wherein the subset of the microLED chips from the first coupon substrate to the second coupon have an increased pitch on the second coupon substrate compared to a pitch of the microLED chips on the first coupon substrate.

3. The method of claim 1, further comprising detecting defective microLEDs on the first coupon substrate, wherein the subset of the microLEDs are selected to exclude the defective microLEDs.

4. The method of claim 3, wherein detecting the defective microLEDs comprises one or more of photoluminescence inspection, electroluminescence inspection and visual inspection using a microscope.

5. The method of claim 1, wherein each one of the transfer elements is activated via a respective heater element that changes at least one of an adhesion and Young's modulus of the transfer element.

6. The method of claim 1, wherein the first and second soft adhesion layers exert an adhesion force that is less that a holding force of each one of the transfer elements and more than a releasing force of each one of the transfer elements.

7. The method of claim 1, wherein the vacancies result from a failed transfer of one or more microLED chips from the first coupon substrate to the second coupon substrate.

8. The method of claim 1, wherein the vacancies result from intentionally not transferring defective microLED chips from the first coupon substrate to the second coupon substrate.

9. The method of claim 1, further comprising selectively removing one or more defective microLED chips from the second coupon substrate resulting in the vacancies on the second coupon substrate.

10. The method of claim 9, wherein the selective removal of the defective microLED chips and the filling of the vacancies is repeated until all microLED chips on the coupon substrate satisfy a yield threshold.

11. The method of claim 1, wherein the transferring of the microLED chips from the epitaxy wafer to the first coupon substrate comprises:

coating an adhesive on a carrier substrate;
moving the epitaxy wafer to contact the carrier-substrate such that the microLED chips are bonded to the adhesive;
thermally or optically releasing a substrate of the epitaxy layer from the microLED chips;
moving the carrier substrate to contact the first coupon substrate such that the microLED chips adhere to the first, soft adhesive layer; and
transferring the microLED chips from the carrier substrate to the first coupon substrate.

12. The method of claim 11, wherein transferring the microLED chips from the epitaxy wafer to the carrier substrate comprises shining laser light through one of the carrier substrate and the epitaxy wafer.

13. The method of claim 11, wherein transferring the microLED chips from the carrier substrate to the first coupon substrate comprises flipping the carrier substrate to face the first coupon substrate.

14. The method of claim 11, wherein transferring the microLED chips from the carrier substrate to the first coupon substrate comprises at least one of application of ultraviolet light, heat, or mechanical force.

15. The method of claim 11, further comprising testing the microLED chips on the carrier substrate, the testing comprising one or more of electroluminescence and photoluminescence measurement of the microLED chips.

16. The method of claim 1, wherein the first and second soft adhesion layers comprises at least one of silicone gel and polydimethylsiloxane.

17. The method of claim 1, further comprising transferring all of the microLED chips from the second coupon substrate to a backplane substrate to form a display.

18. The method of claim 17, wherein the backplane comprises a substrate with thin film transistors formed thereon.

19. The method of claim 17, wherein the backplane comprises a PCB substrate or a silicon substrate.

20. The method of claim 1, wherein the microLEDs have a maximum dimension between one micrometer and one millimeter.

21. The method of claim 1, wherein the other substrate comprises a third soft adhesive layer that holds the pattern of microLED chips.

22. A system comprising:
one or more transfer substrates each having a plurality of transfer elements that are individually actuated to hold and release pluralities of microLED chips as a group;
an epitaxial wafer on which are formed a plurality of microLED chips;
first and second coupon substrates comprising respective first and second soft adhesive layers; and
a controller coupled to the one or more transfer substrates and operable to:
transfer the plurality of microLED chips from the epitaxy wafer to the first soft adhesive layer of the first coupon substrate;
via the one or more transfer substrates, transfer a subset of the plurality of microLED chips from the first coupon substrate to the second soft adhesive layer of the second coupon substrate; and
via the one or more transfer substrates, transfer a pattern of microLED chips from another substrate to the second coupon substrate to fill vacancies in the subset of microLED chips.

23. The system of claim 22 further comprising a backplane substrate of a display, wherein the controller is further operable to transfer all of the microLED chips from the second coupon substrate to the backplane substrate to form the display.

* * * * *